(12) United States Patent
Chen et al.

(10) Patent No.: US 12,178,003 B2
(45) Date of Patent: Dec. 24, 2024

(54) FAN MODULE WITH HANDLE

(71) Applicant: Quanta Computer Inc., Taoyuan (TW)

(72) Inventors: Chao-Jung Chen, Taoyuan (TW);
Chih-Hsiang Lee, Taoyuan (TW);
Wei-Pin Chen, Taoyuan (TW); Jyue Hou, Taoyuan (TW); Cheng-Chieh Weng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 190 days.

(21) Appl. No.: 18/152,863

(22) Filed: Jan. 11, 2023

(65) Prior Publication Data

US 2024/0147658 A1 May 2, 2024

Related U.S. Application Data (60) Provisional application No. 63/381,598, filed on Oct. 31, 2022.

(51) Int. Cl.
*H05K 7/20* (2006.01)

(52) U.S. Cl.
CPC .............................. *H05K 7/20172* (2013.01)

(58) Field of Classification Search
None
See application file for complete search history.

(56) References Cited

U.S. PATENT DOCUMENTS

| | | | |
|---|---|---|---|
| 6,373,698 B1 * | 4/2002 | Christensen | G06F 1/20 361/679.48 |
| 7,701,713 B2 * | 4/2010 | Li | F04D 25/166 361/679.48 |
| 9,307,673 B2 | 4/2016 | Chu et al. | |
| 11,089,707 B2 * | 8/2021 | Lee | G06F 1/183 |
| 2005/0135060 A1 * | 6/2005 | Cote | G11B 33/127 |
| 2016/0053776 A1 * | 2/2016 | Williams | G11B 33/142 415/126 |
| 2020/0068742 A1 * | 2/2020 | Tsorng | H05K 7/20736 |
| 2020/0396862 A1 * | 12/2020 | Tsorng | F04D 25/166 |
| 2022/0071052 A1 * | 3/2022 | Chang | H05K 7/20727 |
| 2023/0204041 A1 * | 6/2023 | Chen | G06F 1/206 |

FOREIGN PATENT DOCUMENTS

| | | |
|---|---|---|
| CN | 104375600 A | 2/2015 |
| TW | 201247086 A | 11/2012 |

OTHER PUBLICATIONS

TW Office Action for Application No. 112113223, mailed Nov. 10, 2023, w/ First Office Action Summary, 7 pp.
TW Search Report for Application No. 112113223, mailed Nov. 10, 2023, 1 p.

* cited by examiner

*Primary Examiner* — Xanthia C Relford
(74) *Attorney, Agent, or Firm* — NIXON PEABODY LLP (57) ABSTRACT

A fan module and computing device with the fan module are disclosed. The fan module includes a handle configured to actuate between an operation state and a release state. The handle in the release state allows a user to vertically remove the fan module from its respective fan module slot and away from the bottom panel.

10 Claims, 13 Drawing Sheets

FAN MODULE WITH HANDLE

CROSS-REFERENCE TO RELATED APPLICATIONS

The present application claims the benefit of and priority to U.S. Provisional Patent Application No. 63/381,598, filed Oct. 31, 2022, the contents of which are hereby incorporated by reference herein in their entirety.

FIELD OF THE INVENTION

The present invention relates generally to a fan module for a computing device, and more specifically, to a fan module with a handle that allows for vertical removal of the fan module from the computing device.

BACKGROUND OF THE INVENTION

Figure 1:
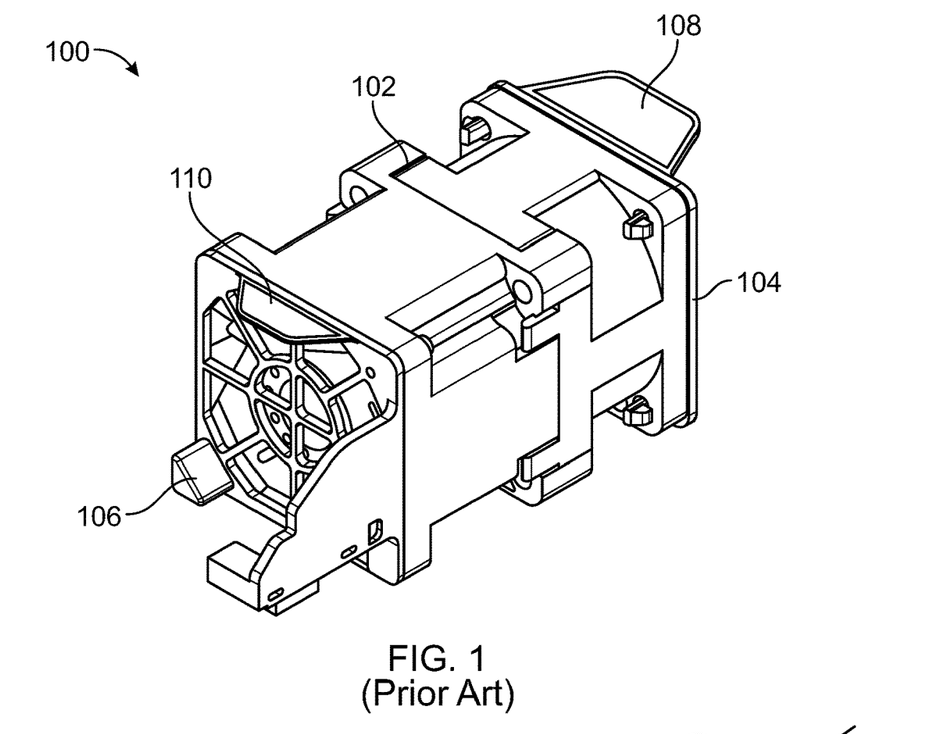
FIG. 1 is a perspective view showing a conventional fan module.

Computing devices, and particularly server computing devices in data centers, include fan modules that help with cooling of the computing devices. Referring to FIG. 1, a conventional fan module 100 is shown. The fan module 100 includes a housing 102, a guard 104, and a carrier 106. The guard 104 and the carrier 106 restrict access inside the housing 102. The guard 104 includes an overhang portion 108. The carrier 106 similarly includes an overhang portion 110.

Figure 2:
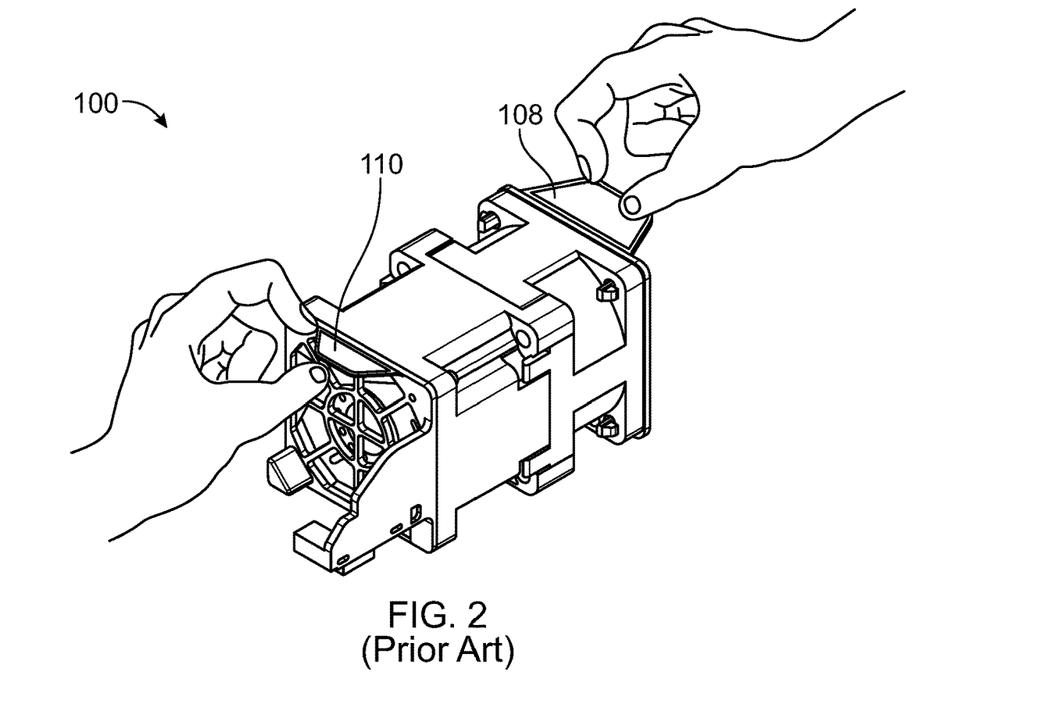
FIG. 2 is a perspective view showing a user grasping a conventional fan module.
Figure 3:
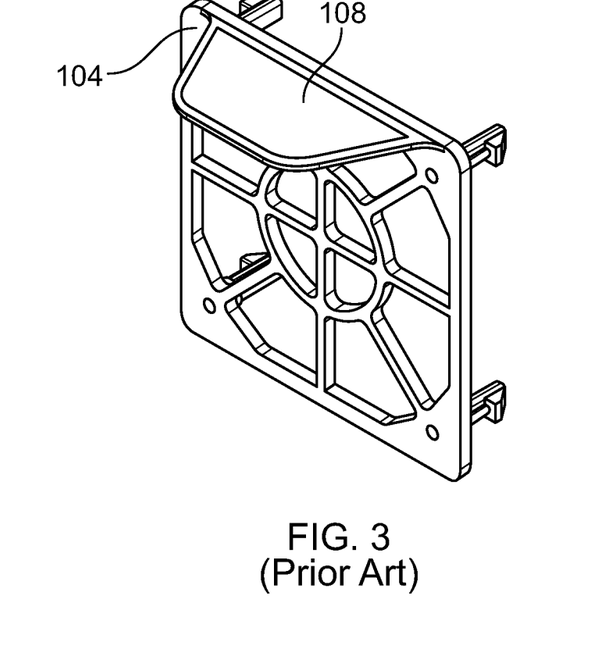
FIG. 3 is a perspective view of a conventional guard of a fan module.
Figure 4:
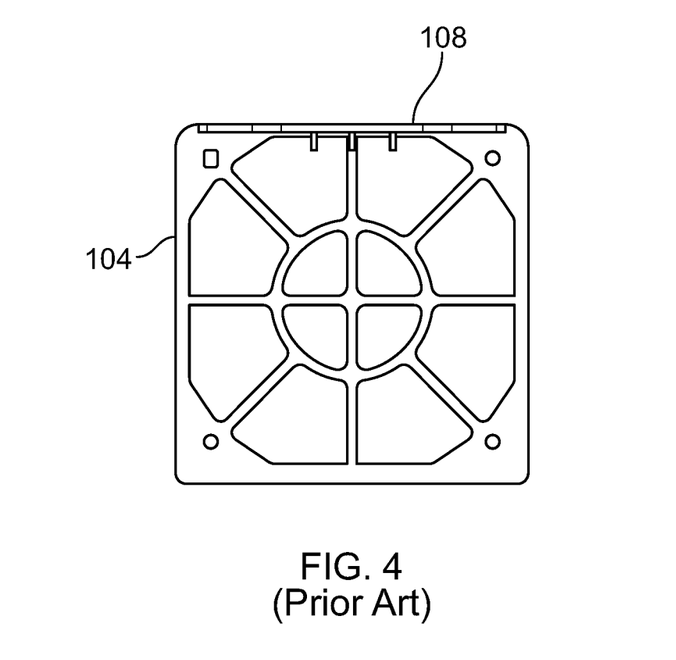
FIG. 4 is a side view of a conventional guard of a fan module.

The fan modules are often required to be replaced, such as for maintenance. The current way of replacing a fan module is to lift the fan module vertically through latches or an operation area of the chassis of a computing device. According to this approach, the method for removing a fan module can be inconvenient. For example, there may be limited operation space surrounding the fan module. Further, the user must lift the fan module using both hands. This results in limited space on the fan module for the user to grasp. For example, and referring to FIG. 2, a user's hands 200 and 202 must grasp the limited space of the overhang portions 108 and 110 to grasp the fan module 100 during removal from the computing device. FIGS. 3 and 4 show detailed views of the guard 104 with its associated overhang portion 108, which presents limited space for a user to effectively grasp for removing the associated fan module (e.g., fan module 100).

Accordingly, a need exists for a fan module, and a computing device with fan modules, that do not suffer from these and similar issues.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an implementation of a fan module is disclosed. The fan module includes a housing having a front side, a back side, and lateral sides. The front side has a front aperture. The back side has a back aperture that is opposite the front side. The lateral sides extend between the front side and the back side. The fan module further includes one or more fans within the housing. The one or more fans are configured to transport air in an airflow direction through the housing between the front aperture and the back aperture. The fan module further includes a carrier connected to the front side of the housing. The carrier is configured to restrict access inside the front aperture. The carrier includes a projection extending away for the housing. The projection has a connector configured to electrically connect the fan module to the computing device to power the fan module. The fan module further includes a handle rotatably connected to the carrier. The handle includes a cross member spanning generally the front side of the housing along its width. The handle further includes two arms connected at first ends to the carrier. The two arms are further connected at second ends to the cross member. The second ends are opposite the first ends. The handle is configured to rotate between an operation state and a release. In the operation state, the two arms extend from the housing, generally parallel to the air flow direction, with one of the two arms resting on the projection. In the release state, the two arms extend away from the housing, generally perpendicular to the air flow direction.

According to certain further aspects, the fan module further includes a guard connected to the back side of the housing. The guard is configured to restrict access inside the back aperture. According to some aspects, the entire surface of the guard facing away from the housing is flat. According to some aspects, the handle in the operation state is in a path of the air passing through the housing.

According to certain aspects of the present disclosure, another implementation of a fan module is disclosed. The fan module includes a housing a front side, a back side, and lateral sides. The front side has a front aperture. The back side has a back aperture that is opposite the front side. The lateral sides extend between the front side and the back side. The fan module further includes one or more fans within the housing. The one or more fans are configured to transport air in an airflow direction through the housing between the front aperture and the back aperture. The fan module further includes a carrier connected to the front side of the housing. The carrier is configured to restrict access inside the front aperture. The carrier includes two projections that extend away from each other on opposite sides of the carrier. The fan module further includes a handle slidably connected to the carrier. The handle includes a cross member spanning generally the width of the front side of the housing. The handle further includes two arms connected at first ends to the cross member. Each one of the two arms includes a slot, with one of the two projections fixed within the slot such that the two arms slide about the two projections. The handle is configured to slide between an operation state and a release state. In the operation state, the handle is retracted against the carrier, with each projection at generally a first end of a respective slot. In the release state, the two arms extend away from the housing, generally perpendicular to the air flow direction, with each projection abutting a second end of the respective slot, opposite the first end.

According to certain further aspects, the carrier includes a projection extending away for the housing. The projection includes a connector configured to electrically connect the fan module to the computing device to power the fan module. The connector faces away from a direction that the two arms extend in the release state. According to certain further aspects, the fan module includes a guard connected to the back side of the housing. The guard is configured to restrict access inside the back aperture. According to some aspects, an entire surface of the guard facing away from the housing is flat.

According to certain aspects of the present disclosure, a chassis for a computing device is disclosed. The chassis includes a bottom panel configured to hold one or more components of the computing device. The bottom panel includes a plurality of fan module slots. The computing device further includes a plurality of fan modules. Each fan module is configured to fit within a fan module slot of the plurality of fan module slots. Each fan module includes a handle configured to actuate between an operation state and a release state. The handle in the release state allows a user to vertically remove the fan module from its respective fan module slot and away from the bottom panel.

According to some aspects, the handle is configured to actuate by sliding between the operation state, with the handle generally perpendicular with the bottom panel, and the release state, with the handle generally perpendicular with the bottom panel. According to some aspects, the handle is configured to actuate by rotating between the operation state, with the handle generally parallel with the bottom panel, and the release state, with the handle generally perpendicular with the bottom panel.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure is directed to a fan module that allows for removal from a computing device with one hand operation. The fan module of the present disclosure further obtains this advantage while still allowing for a reduced operation area around the fan module. The fan module of the present disclosure also removes the need to have operation areas on the fan module for the user to grip, such as the overhang portions 108 and 110 discussed above with respect to the fan module 100.

Figure 5:
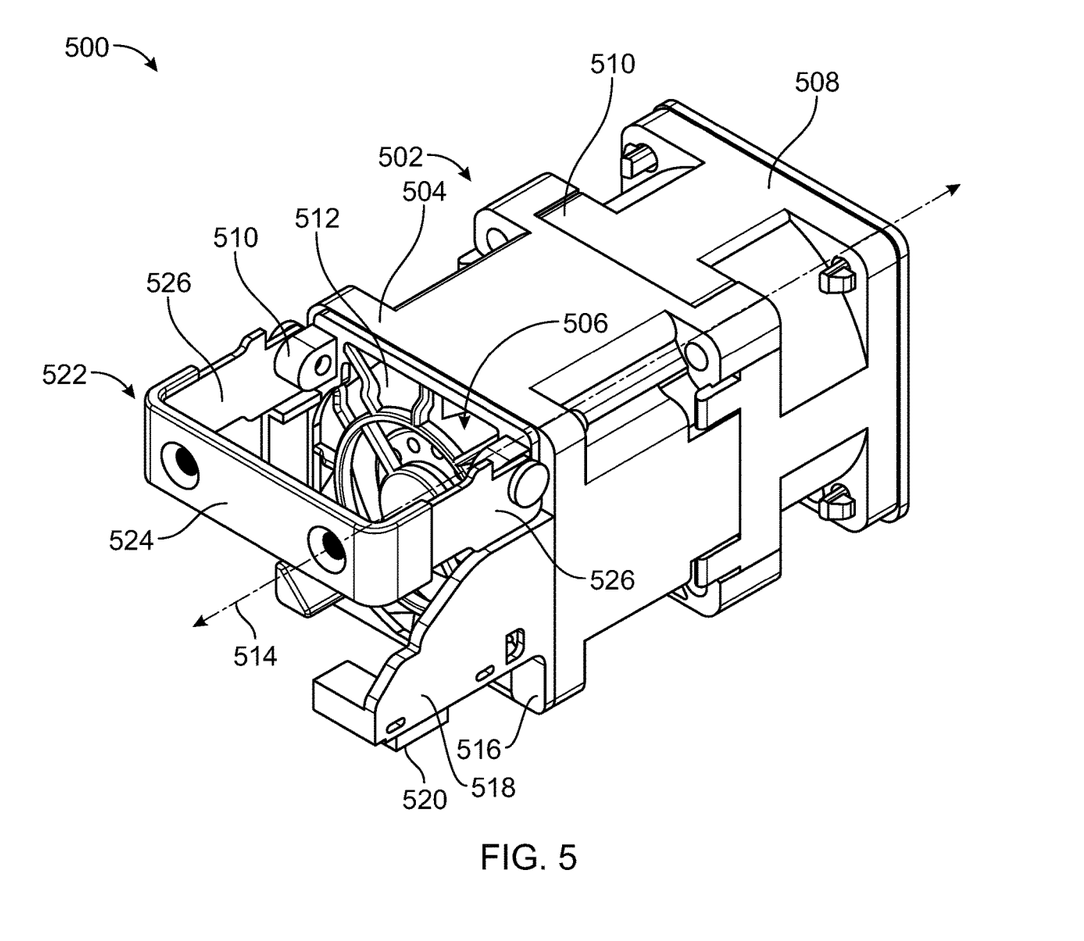
FIG. 5 is a perspective view of an implementation of a fan module, according to certain aspects of the present disclosure.

FIG. 5 is a perspective view of an implementation of a fan module 500, according to certain aspects of the present disclosure. The fan module 500 can be for a computing device (FIGS. 11 and 12), such as for transporting air through the computing device for cooling purposes. The fan module 500 includes a housing 502. The housing 502 has a front side 504 with a front aperture 506. The housing 502 also includes a back side 508 with a back aperture (not shown), opposite the front side 504. The housing 502 further includes lateral sides 510 extending between the front side 504 and the back side 508.

The fan module 500 further includes one or more fans 512 within the housing 502. The one or more fans 512 are configured to transport air in an airflow direction, represented by the line 514, through the housing 502 between the front aperture 506 and the back aperture (not shown).

The fan module 500 further includes a carrier 516 connected to the front side 504 of the housing 502. The carrier 516 is configured to restrict access inside the front aperture 506. The carrier 516 includes a projection 518 that extends away for the housing 502. The projection 518 has a connector 520 configured to electrically connect the fan module 500 to a computing device (FIGS. 11 and 12) to power the fan module 500. The connector 520 can be configured to connect to a computing device when the fan module 500 is lowered into the computing device.

The fan module 500 further includes a handle 522 rotatably connected to the carrier 516. The handle 522 includes a cross member 524 spanning generally the width of the front side 504 of the housing 502. The handle 522 further includes two arms 526 connected at first ends to the carrier 516 and connected at second ends, opposite the first ends, to the cross member 524.

The arrangement of the fan module 500 in FIG. 5 is an operation state. In the operation state, the two arms 526 extend away from the housing 502, generally parallel to the air flow direction 514, with one of the two arms 526 resting on the projection 518. The arm 526 resting on the projection 518 prevents the handle 522 from over rotating.

Figure 6:
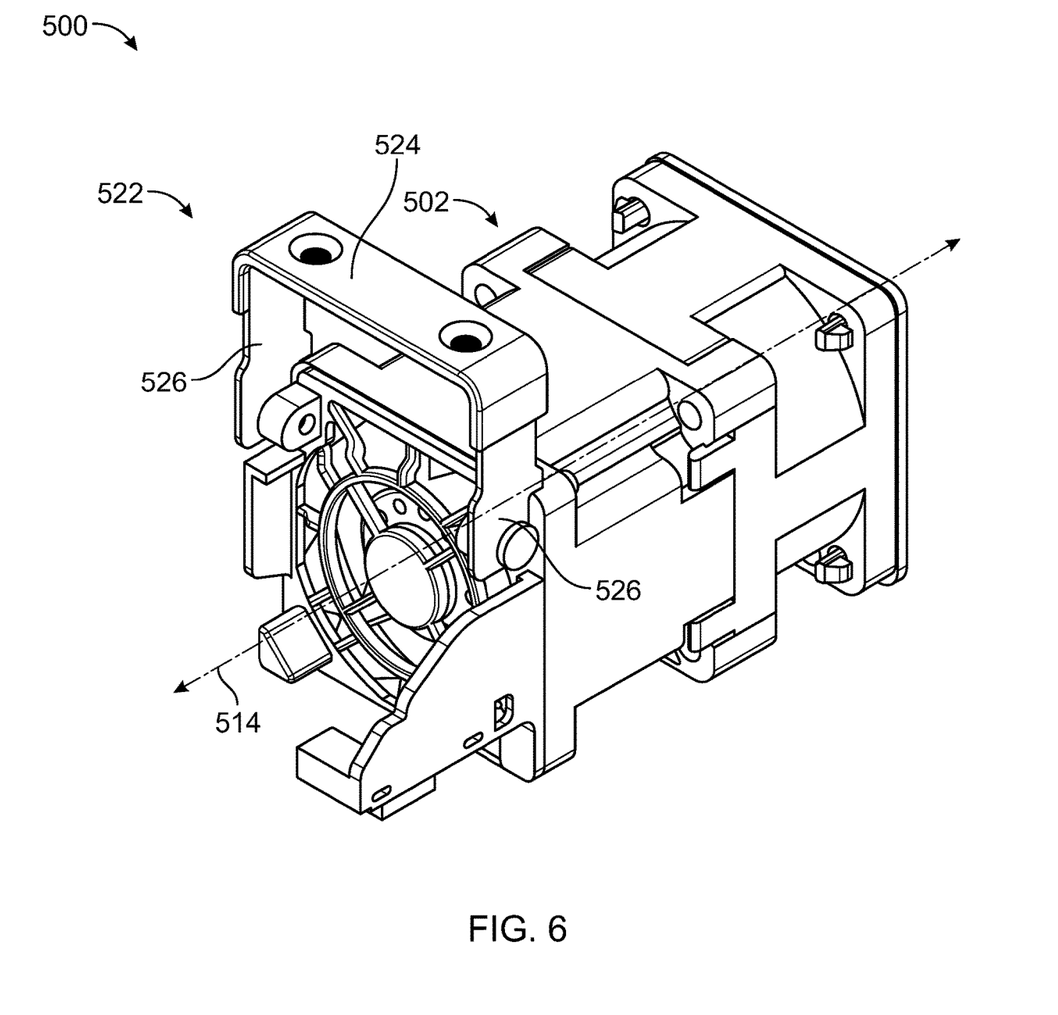
FIG. 6 is a perspective view of the fan module of FIG. 5 in a release state, according to certain aspects of the present disclosure.

FIG. 6 is a perspective view of the fan module 500 of FIG. 5 in a release state, according to certain aspects of the present disclosure. In the release state, the two arms 526 extend away from the housing 502, generally perpendicular to the air flow direction 514. In the release state, a user can grab the fan module 500 by the handle 522, and specifically the cross member 524, to lift the fan module 500 vertically out from a chassis of a computing device (FIGS. 11 and 12) with one hand. Thus, the handle 522 makes it easier for a user to remove the fan module 500 from a computing device by needing only one hand rather than two.

Figure 7:
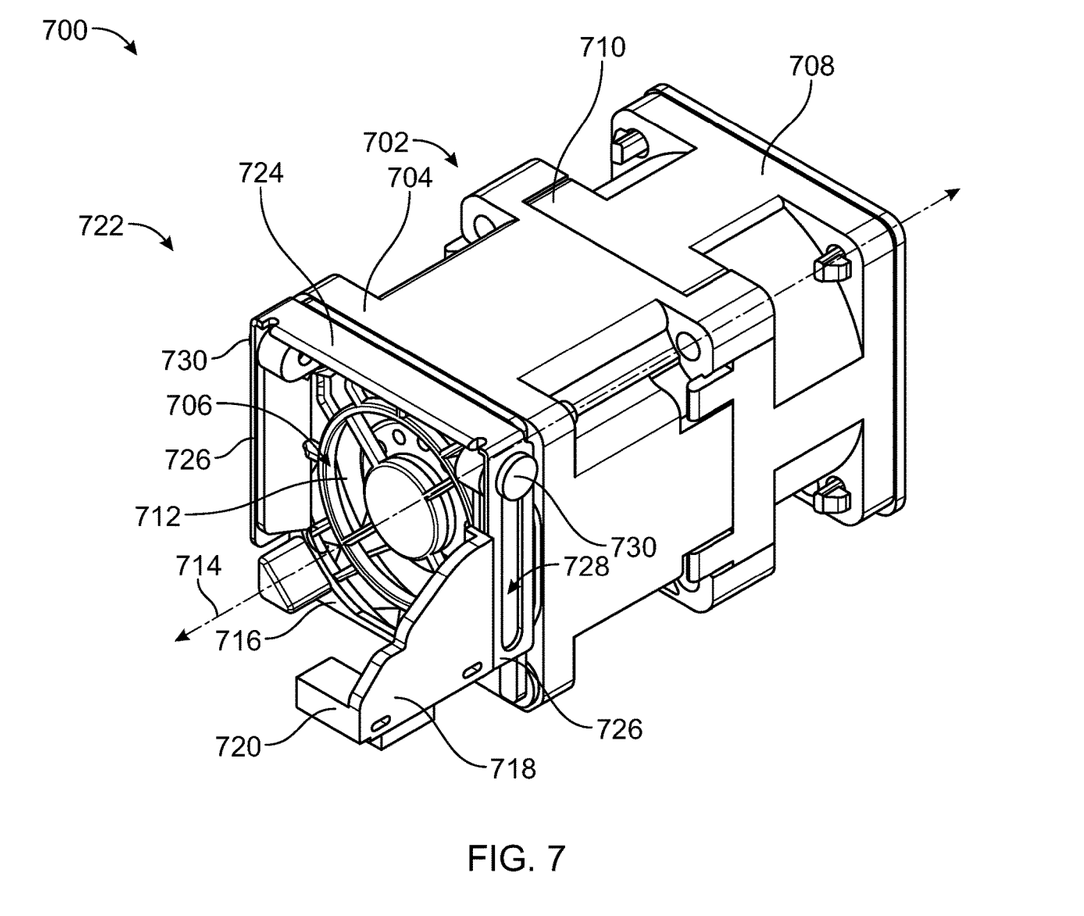
FIG. 7 is a perspective view of another implementation of a fan module, according to certain aspects of the present disclosure.

FIG. 7 is a perspective view of another implementation of a fan module 700, according to certain aspects of the present disclosure. The fan module 700 can be for a computing device (FIGS. 11 and 12), such as for transporting air through the computing device for cooling purposes. The fan module 700 includes a housing 702. The housing 702 has a front side 704 with a front aperture 706. The housing 702 also includes a back side 708 with a back aperture (not shown), opposite the front side 704. The housing 702 further includes lateral sides 710 extending between the front side 704 and the back side 708.

The fan module 700 further includes one or more fans 712 within the housing 702. The one or more fans 712 are configured to transport air in an airflow direction, represented by the line 714, through the housing 702 between the front aperture 706 and the back aperture (not shown).

The fan module 700 further includes a carrier 716 connected to the front side 704 of the housing 702. The carrier 716 is configured to restrict access inside the front aperture 706. The carrier 716 includes a projection 718 that extends away for the housing 702. The projection 718 has a connector 720 configured to electrically connect the fan module 700 to a computing device (FIGS. 11 and 12) to power the fan module 700.

The fan module 700 further includes a handle 722 slidably connected to the carrier 716. The handle 722 includes a cross member 724 spanning generally the width of the front side 704 of the housing 702. The handle 722 further includes two arms 726 slidably connected to the carrier 716 about slots 728 in the two arms 726, as further discussed below. The two arms 726 are also connected to the cross member 724.

Referring back to the carrier 716, the carrier 716 includes two projections 730 that extend away from each other on opposite sides of the carrier 716. The projections 730 generally are in the shape of a T, with the narrow portion connected to the carrier 716. The projections 730 retain the two arms 726 by extending through the slots 728 of the two arms 726.

The arrangement of the fan module 700 in FIG. 7 is an operation state. In the operation state, the handle 722 is retracted against the carrier 716, with each projection 730 at generally a first end of a respective slot 728. In the retracted position shown in FIG. 7, the handle 722 does not extend beyond the dimensions of the housing 702 or the carrier 716.

Figure 8:
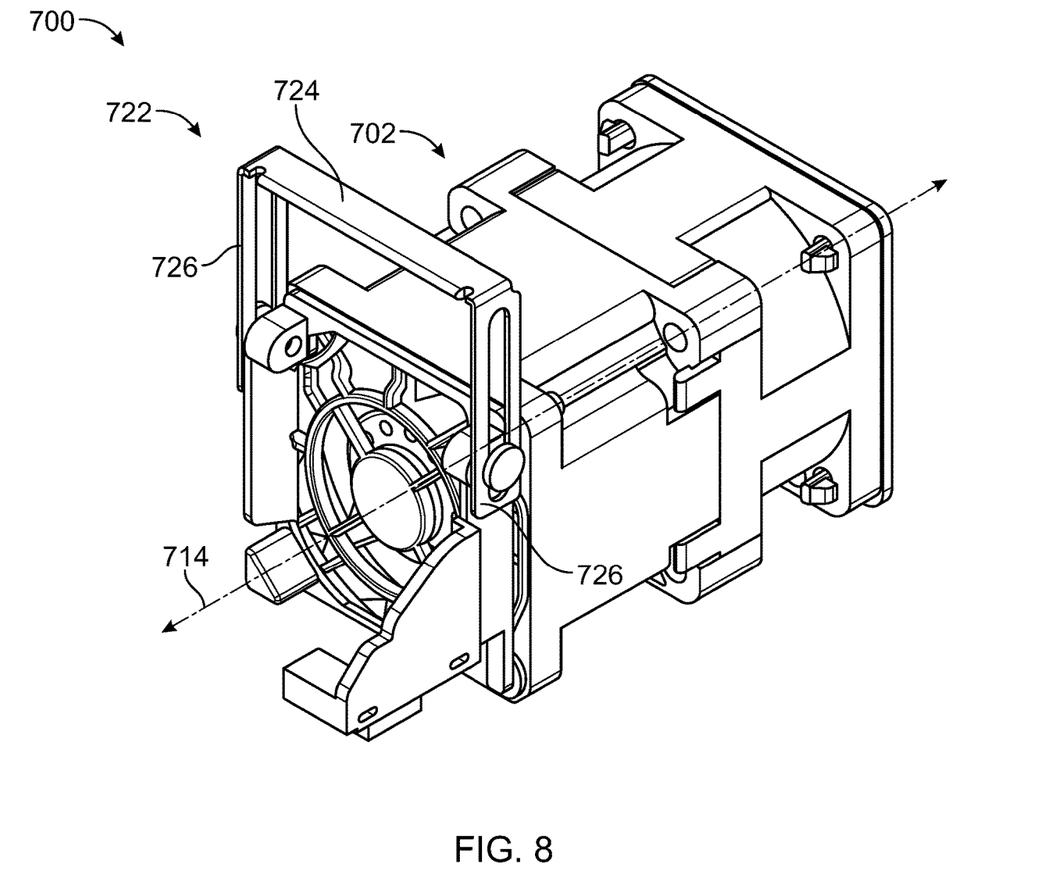
FIG. 8 is a perspective view of the fan module of FIG. 7 in a release state, according to certain aspects of the present disclosure.

FIG. 8 is a perspective view of the fan module 700 of FIG. 7 in a release state, according to certain aspects of the present disclosure. In the release state, the two arms 726 extend away from the housing 702, generally perpendicular to the air flow direction 714. This causes each projection 730 to contact a respective end of a respective slot 728. In the release state, a user can grab the fan module 700 by the handle 722, and specifically the cross member 724, to lift the fan module 700 vertically out from a chassis of a computing device (FIGS. 11 and 12) with one hand. Thus, the handle 722 makes it easier for a user to remove the fan module 700 from a computing device by needing only one hand rather than two.

Figure 9:
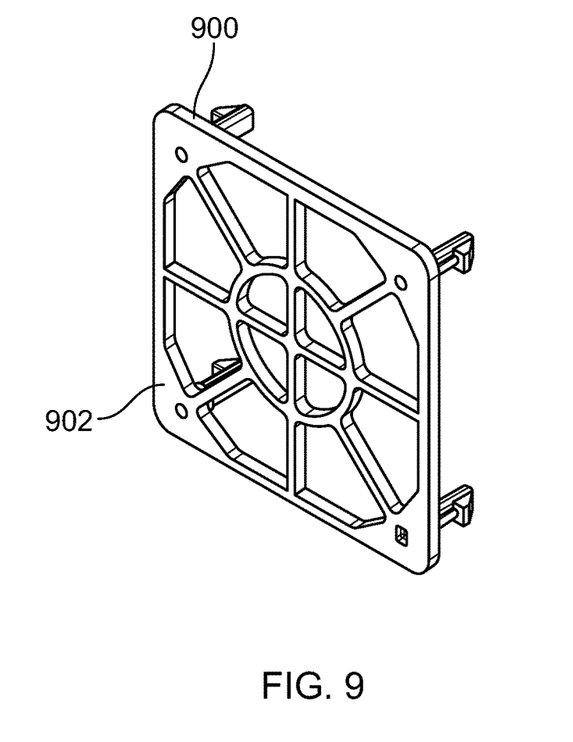
FIG. 9 is a perspective view of a guard, according to certain aspects of the present disclosure.
Figure 10:
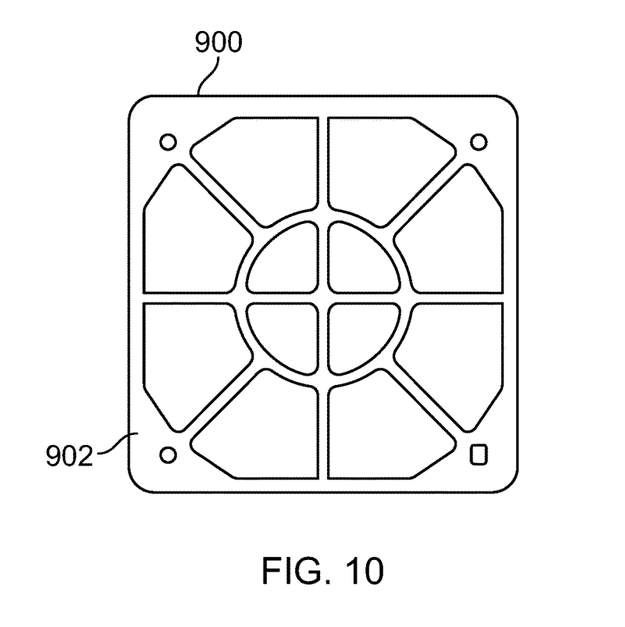
FIG. 10 is a side view of a guard, according to certain aspects of the present disclosure.

FIG. 9 is a perspective view of a guard 900 of a fan module, and FIG. 10 is a side view of the guard 900, according to certain aspects of the present disclosure. The guard 900 can be, for example, attached to the back sides 508 and 708 of the fan modules 500 and 700, respectively, to prevent or limit access inside the housings 502 and 702, respectively. In contrast to the guard 104 of FIGS. 1 and 2, the guard 900 does not need and overhang portion, such as the overhang portion 108 of the guard 104, for a user to grasp. Instead, the entire surface 902 of the guard 900 that faces away from a fan module onto which the guard 900 is attached can be flat. This results in the fan module with the guard 900 requiring less operation space surrounding the fan module.

Similarly, and referring back to FIGS. 5-8, the carriers 516 and 716 of the fan modules 500 and 700, respectively, do not need overhang portions, like the overhang portion 11 of the fan module 100. Instead, a user can grasp the handles 522 and 722 for removing the fan modules 500 and 700, respectively.

Figure 11A:
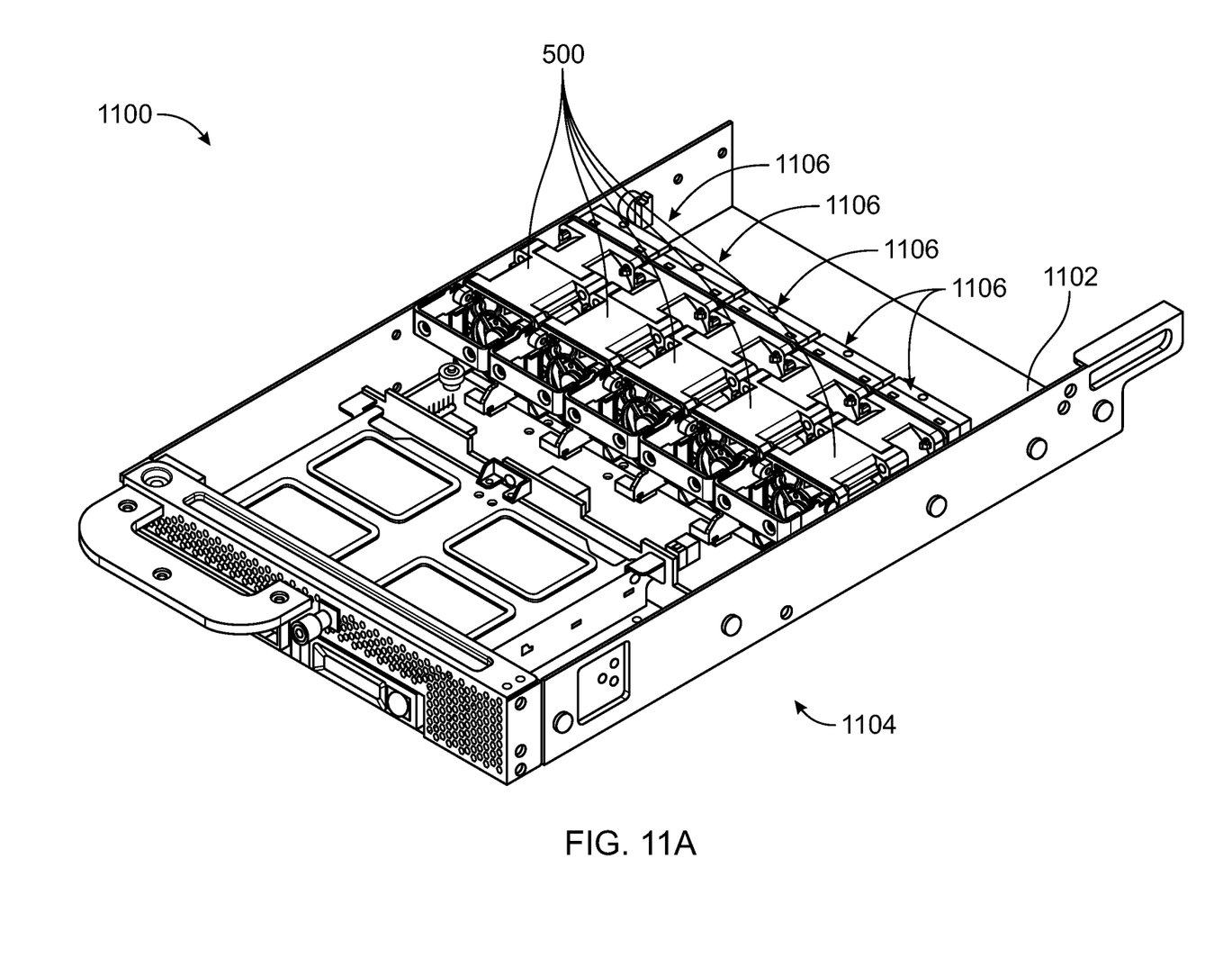
FIG. 11A is a perspective view of a step for removing a fan module of the present disclosure from a chassis, according to certain aspects of the present disclosure.
Figure 11B:
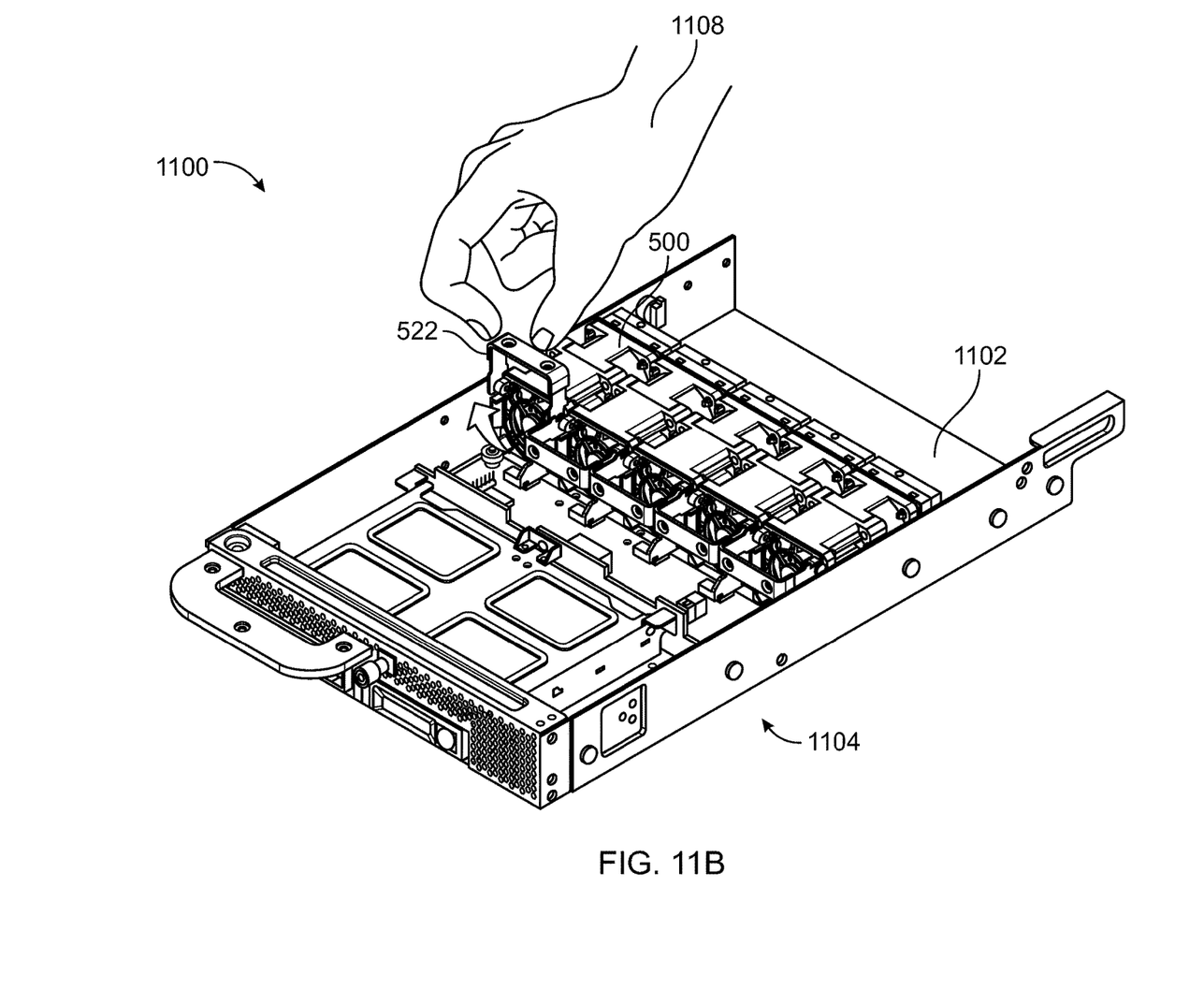
FIG. 11B is a perspective view of another step for removing a fan module of the present disclosure from a chassis, according to certain aspects of the present disclosure.
Figure 11C:
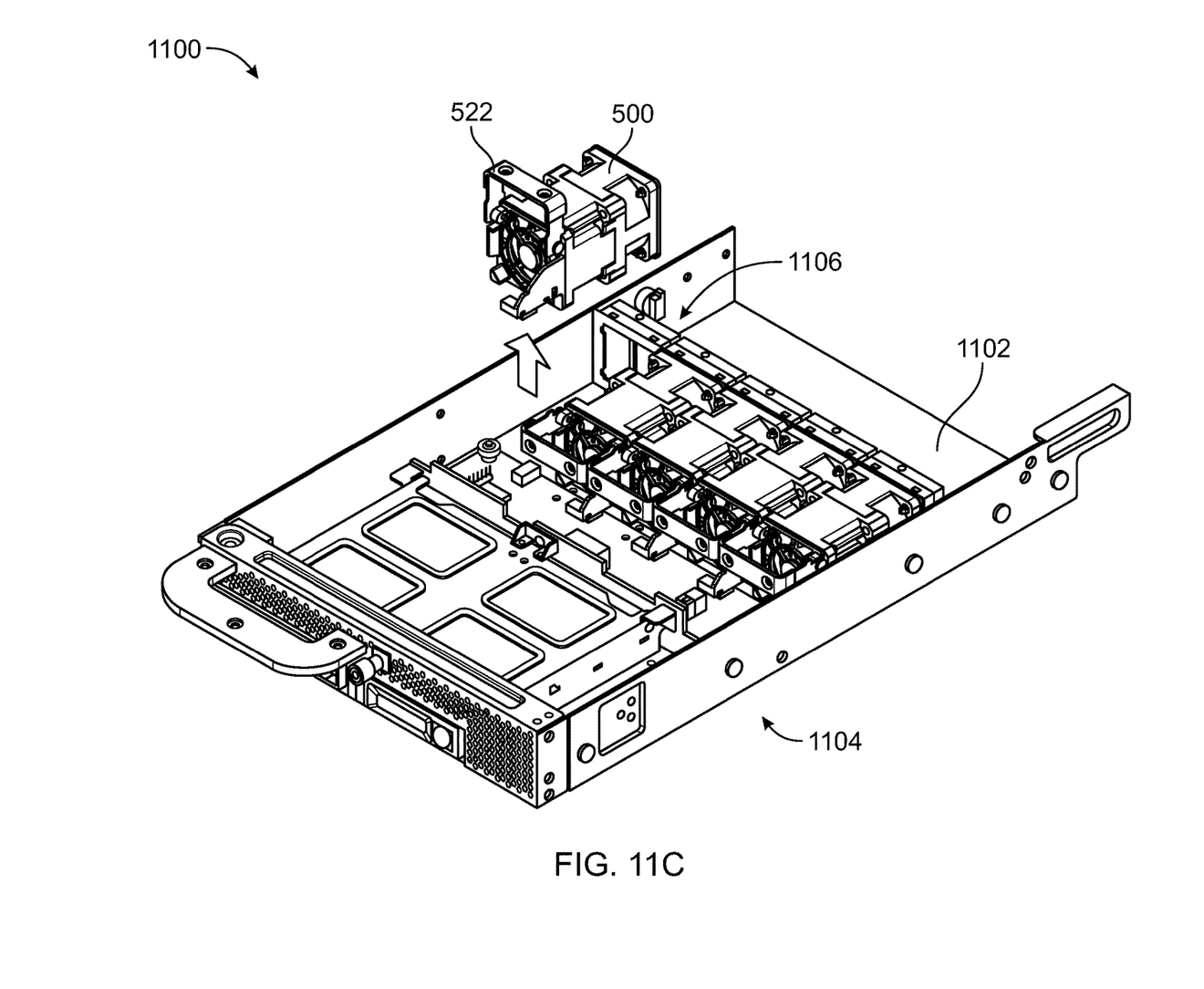
FIG. 11C is a perspective view of another step for removing a fan module of the present disclosure from a chassis, according to certain aspects of the present disclosure.

FIGS. 11A-11C show perspective views of steps for removing a fan module 500 from a computing device 1100, according to certain aspects of the present disclosure. Referring to FIG. 11A, the computing device 1100 includes a bottom panel 1102 that partially defines the chassis 1104. The bottom panel 1102 is configured to hold one or more components of the computing device 1100, including a plurality of fan modules 500 within corresponding slots 1106. Each of the fan modules 500 are shown in the operation state, such as that shown and disclosed above with respect to FIG. 5. Although only fan modules 500 are shown, different types of fan modules can be retained in the computing device 1100, such as the fan module 700 or different fan modules.

Referring to FIG. 11B, when the user (as represented by the hand 1108) wants to remove a fan module 500, the user 1108 simply actuates the fan module 500 from the operation state (FIG. 5) to the release state (FIG. 6) by rotating the handle 522 of the respective fan module 500 into the release state.

Referring to FIG. 11C, the respective fan module 500 is shown lifted vertically up from its corresponding slot 1106. Because the fan module 500 includes the handle 522, the fan module 500 can be lifted as shown in FIG. 11C by a user using a single hand. Thus, the fan module 500 is easier to remove from the computing device 1100 than it would be to remove a conventional fan module 100.

Figure 12A:
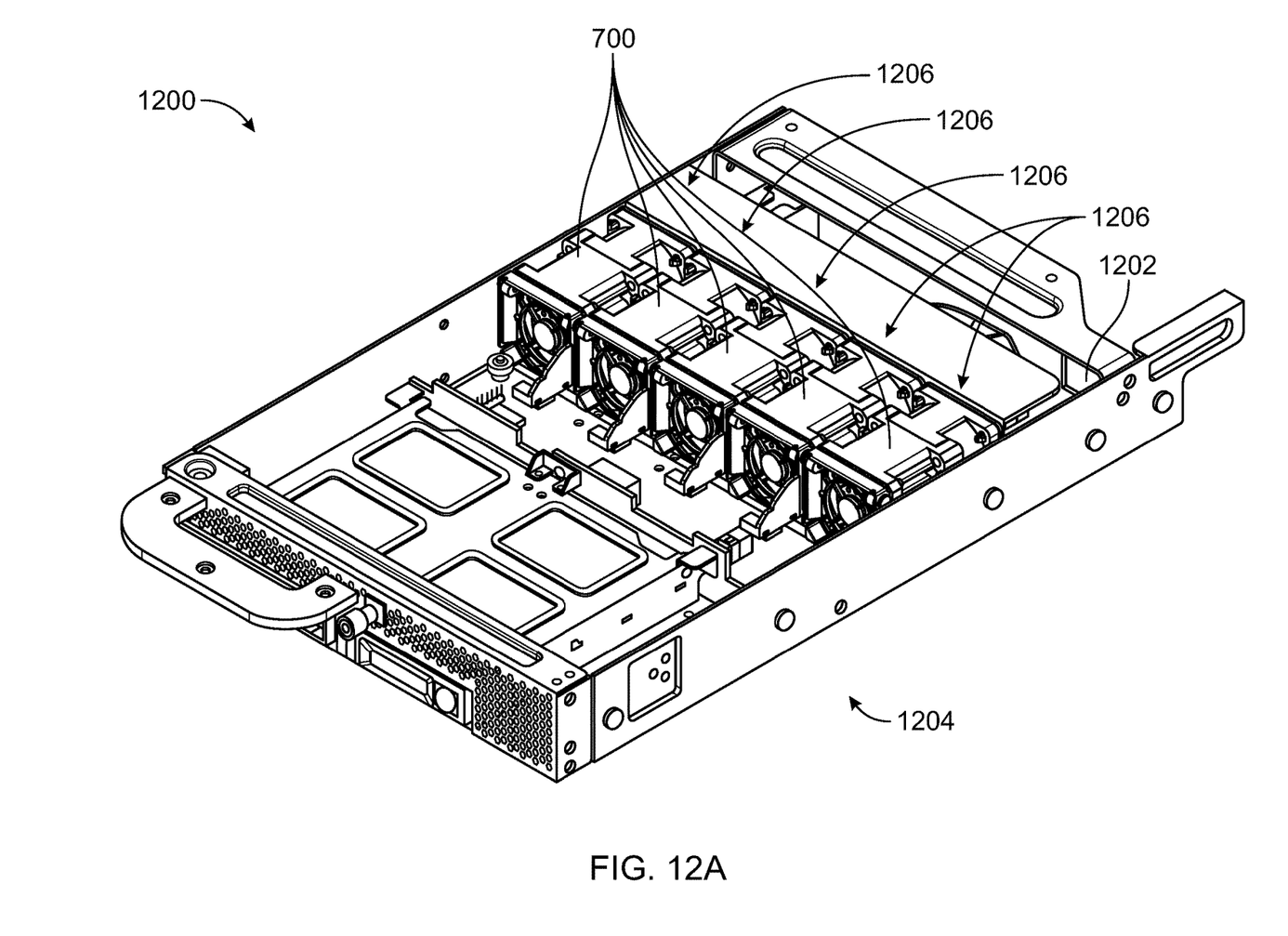
FIG. 12A is a perspective view of a step for removing another fan module of the present disclosure from a chassis, according to certain aspects of the present disclosure.
Figure 12B:
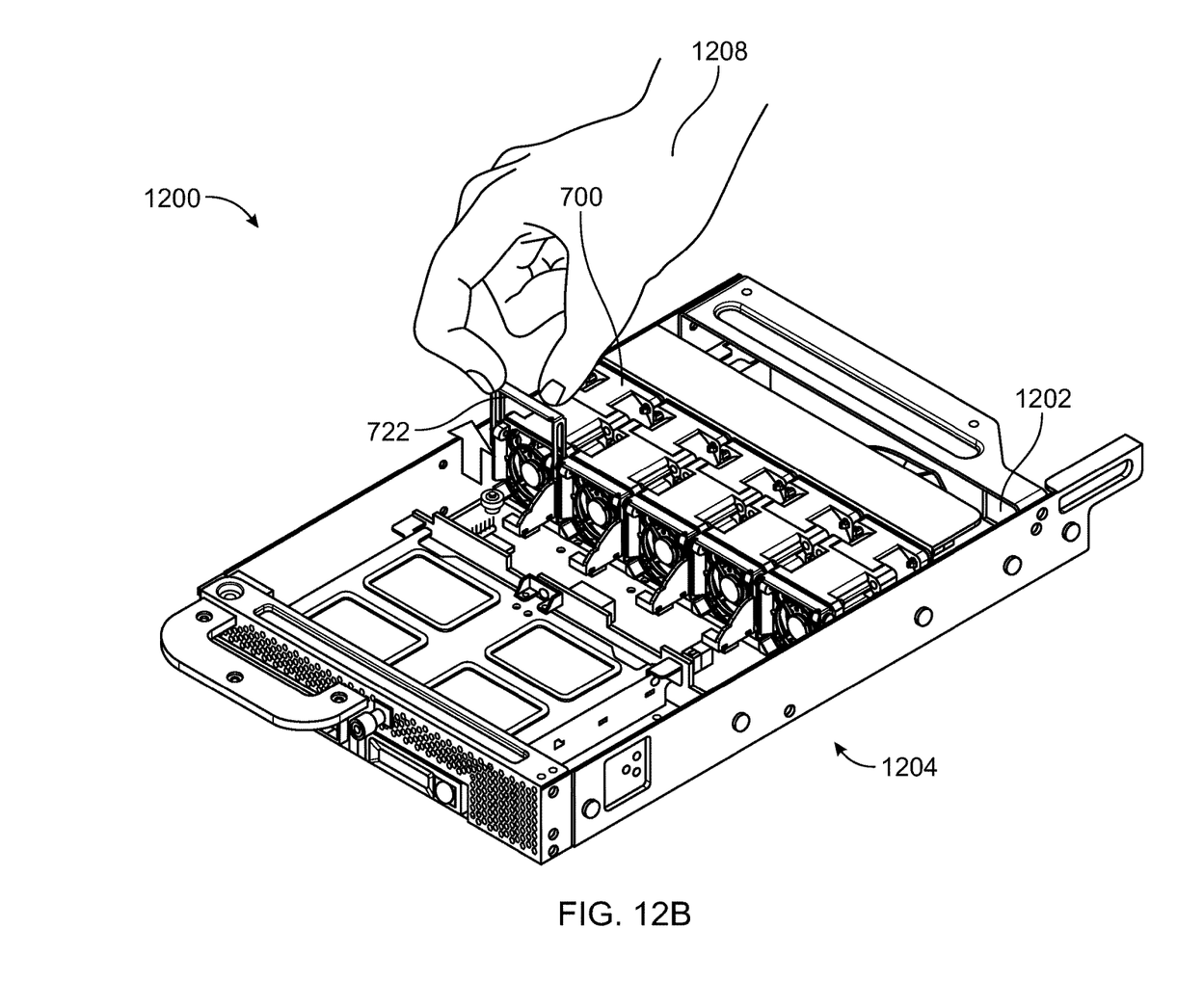
FIG. 12B is a perspective view of another step for removing another fan module of the present disclosure from a chassis, according to certain aspects of the present disclosure.
Figure 12C:
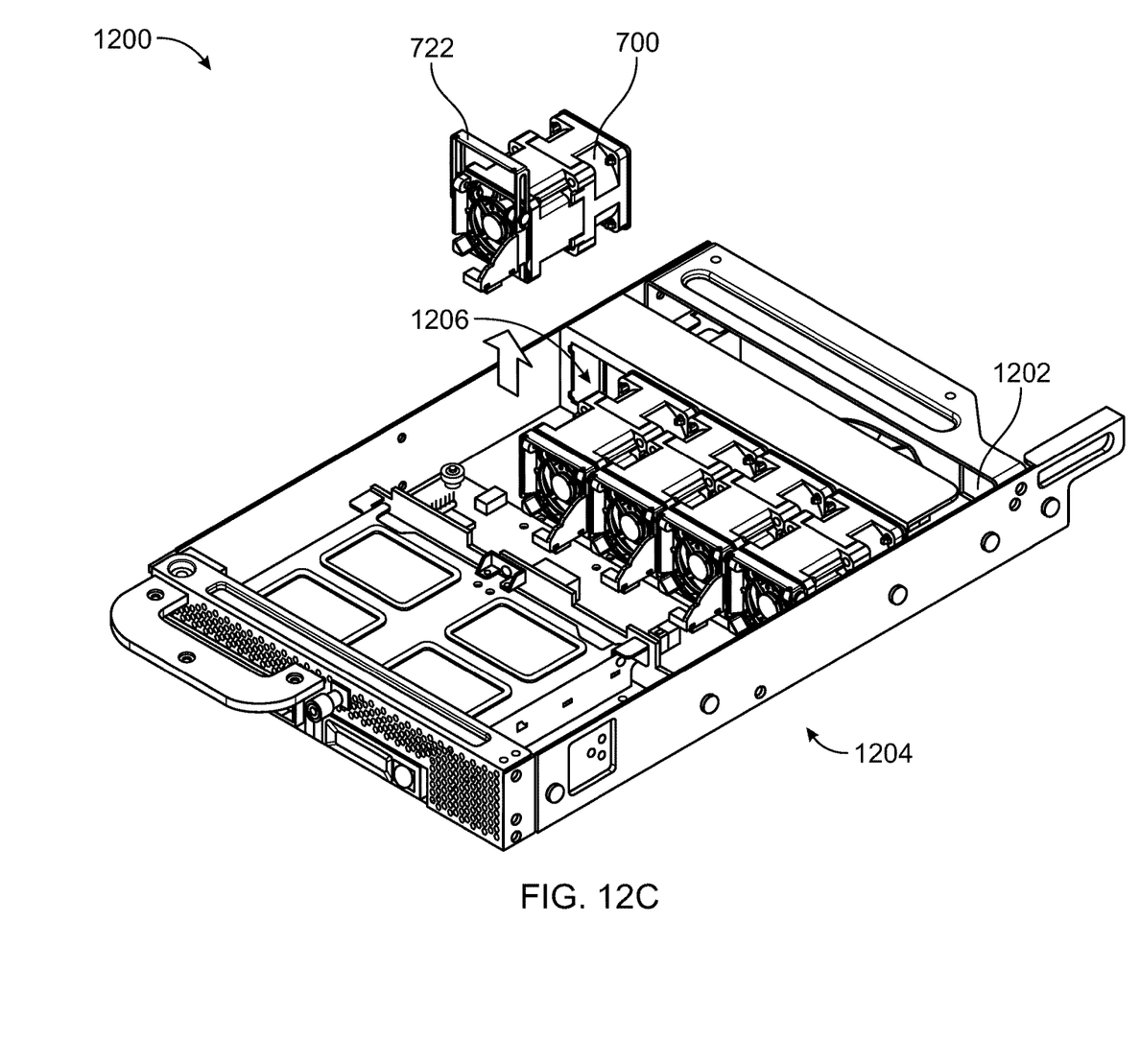
FIG. 12C is a perspective view of another step for removing another fan module of the present disclosure from a chassis, according to certain aspects of the present disclosure.

FIGS. 12A-12C show perspective views of steps for removing a fan module 700 from a computing device 1200, according to certain aspects of the present disclosure. Referring to FIG. 12A, the computing device 1200 includes a bottom panel 1202 that partially defines the chassis 1204. The bottom panel 1202 is configured to hold one or more components of the computing device 1200, including a plurality of fan modules 700 within corresponding slots 1206. Each of the fan modules 700 are shown in the operation state, such as that shown and disclosed above with respect to FIG. 7. Although only fan modules 500 are shown, different types of fan modules can be retained in the computing device 1100, such as the fan module 700 or different fan modules.

Referring to FIG. 12B, when the user (as represented by the hand 1208) wants to remove a fan module 700, the user 1208 simply actuates the fan module 700 from the operation state (FIG. 7) to the release state (FIG. 8) by sliding the handle 722 of the respective fan module 700 into the release state.

Referring to FIG. 12C, the respective fan module 700 is shown lifted vertically up from its corresponding slot 1206. Because the fan module 700 includes the handle 722, the fan module 700 can be lifted as shown in FIG. 7C by a user using a single hand. Thus, the fan module 700 is easier to remove from the computing device 1200 than it would be to remove a conventional fan module 100.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A fan module for a computing device, the fan module comprising:
   a housing having a front side, a back side, and lateral sides, the front side having a front aperture, the back side having a back aperture that is opposite the front side, the lateral sides extending between the front side and the back side;
   one or more fans within the housing, the one or more fans being configured to transport air in an airflow direction through the housing between the front aperture and the back aperture;
   a carrier connected to the front side of the housing, the carrier being configured to restrict access inside the front aperture, the carrier including a projection extending away for the housing, the projection having a connector configured to electrically connect the fan module to the computing device to power the fan module; and
   a handle rotatably connected to the carrier, the handle including
      a cross member spanning generally the front side of the housing along its width; and
      two arms connected at first ends to the carrier, the two arms being further connected at second ends to the cross member, the second ends being opposite the first ends;
   wherein the handle is configured to rotate between
      an operation state in which the two arms extend away from the housing, the handle being generally parallel to the air flow direction and one of the two arms resting on the projection, and
      a release state in which the two arms extend from the housing, the handle being generally perpendicular to the air flow direction.

2. The fan module of claim 1, further comprising a guard connected to the back side of the housing, the guard configured to restrict access inside the back aperture.

3. The fan module of claim 2, wherein an entire surface of the guard facing away from the housing is flat.

4. The fan module of claim 1, wherein the handle in the operation state is in a path of the air passing through the housing.

5. A fan module for a computing device, the fan module comprising:
   a housing having a front side, a back side, and lateral sides, the front side having a front aperture, the back side having a back aperture that is opposite the front side, and the lateral sides extending between the front side and the back side;

one or more fans within the housing, the one or more fans being configured to transport air in an airflow direction through the housing between the front aperture and the back aperture;

a carrier connected to the front side of the housing, the carrier being configured to restrict access inside the front aperture, the carrier including two projections extending away from each other on opposite sides of the carrier; and a handle slidably connected to the carrier, the handle including:

a cross member spanning generally the front side of the housing along its width; and two arms connected at first ends to the cross member, each one of the two arms including a slot, with one of the two projections fixed within the slot such that the two arms slide about the two projections;

wherein the handle is configured to slide between:

an operation state in which with the handle res against the carrier, with each projection at generally a first end of a respective slot; and a release state in which the two arms extend from the housing, the handle being generally perpendicular to the air flow direction, with each projection abutting a second end of the respective slot, opposite the first end.

6. The fan module of claim 5, wherein the carrier includes a projection extending away for the housing.

7. The fan module of claim 6, wherein the projection includes a connector configured to electrically connect the fan module to the computing device to power the fan module.

8. The fan module of claim 7, wherein the connector faces away from a direction that the two arms extend in the release state.

9. The fan module of claim 5, further comprising a guard connected to the back side of the housing, the guard configured to restrict access inside the back aperture.

10. The fan module of claim 9, wherein an entire surface of the guard facing away from the housing is flat.

* * * * *